(12) United States Patent
Revankar et al.

(10) Patent No.: US 8,993,056 B2
(45) Date of Patent: Mar. 31, 2015

(54) METHOD OF GAS DISTRIBUTION AND NOZZLE DESIGN IN THE IMPROVED CHEMICAL VAPOR DEPOSITION OF POLYSILICON REACTOR

(75) Inventors: Vithal Revankar, Houston, TX (US); Sanjeev Lahoti, Houston, TX (US)

(73) Assignee: Savi Research, Inc., Houston, TX (US)

( * ) Notice: Subject to any disclaimer, the term of this patent is extended or adjusted under 35 U.S.C. 154(b) by 487 days.

(21) Appl. No.: 12/970,562

(22) Filed: Dec. 16, 2010

(65) Prior Publication Data
US 2011/0151137 A1    Jun. 23, 2011

Related U.S. Application Data

(60) Provisional application No. 61/287,417, filed on Dec. 17, 2009.

(51) Int. Cl.
*C01B 33/035* (2006.01)
*C23C 16/24* (2006.01)
*C23C 16/455* (2006.01)

(52) U.S. Cl.
CPC ............... *C23C 16/24* (2013.01); *C01B 33/035* (2013.01); *C23C 16/45517* (2013.01); *C23C 16/45563* (2013.01)

USPC .............. 427/255.18; 427/255.11; 427/248.1; 118/719

(58) Field of Classification Search
None
See application file for complete search history.

(56) References Cited

U.S. PATENT DOCUMENTS

| 3,057,690 | A  | * | 10/1962 | Reuschel et al. | ............... 423/350 |
| 5,478,396 | A  | * | 12/1995 | Keck et al. | ................... 118/719 |
| 6,749,824 | B2 | * | 6/2004 | Keck et al. | ................... 423/348 |
| 8,399,072 | B2 | * | 3/2013 | Revankar et al. | ............. 427/588 |
| 2006/0086318 | A1 | * | 4/2006 | Matsubara et al. | ........... 118/715 |

\* cited by examiner

*Primary Examiner* — Mandy Louie
(74) *Attorney, Agent, or Firm* — Baker & McKenzie LLP

(57) ABSTRACT

An improved process and apparatus for uniform gas distribution in chemical vapor deposition (CVD) Siemens type processes is provided. The process comprises introduction of a silicon-bearing gas tangentially to and uniformly along the length of a growing silicon rod in a CVD reactor, resulting in uniform deposition of polysilicon along the rod. The apparatus comprises an improved gas nozzle design and arrangement along the length of the rod, promoting uniform deposition of polysilicon.

7 Claims, 5 Drawing Sheets

Slit Design  No Slit Design

METHOD OF GAS DISTRIBUTION AND NOZZLE DESIGN IN THE IMPROVED CHEMICAL VAPOR DEPOSITION OF POLYSILICON REACTOR

FIELD OF THE INVENTION

The present invention relates to a novel method for the gas distribution in the chemical vapor deposition (CVD) of a polysilicon reactor. In particular, the present invention relates to the gas distribution nozzle design and arrangement along the length of the chunk rod for producing polysilicon chunk materials via the decomposition of gaseous silane precursors.

BACKGROUND OF THE INVENTION

The production of polysilicon chunk materials via the decomposition of a gaseous precursor compound on a slim rod substrate is a well-known, widely used process commonly referred to as the "Siemens process." The Siemens process is a combined decomposition/deposition process that comprises: (1) a heated rod or rods (appropriate substrates) covered by a suitable enclosure to allow high temperature, air-tight operation; (2) a system to feed the precursor material or compound of desired composition without contamination; (3) heating the enclosed rods to a desired temperature under appropriate environment; (4) decomposing the precursor material preferentially on the heated surface of the rods/substrate by distributing the gas appropriately near the growing rod vicinity; (5) recovery or disposal of byproduct or gases; and (6) recovery of product without contaminating the product.

In typical Siemens processes and reactors, the reactant gas is fed to the rods from a single port/nozzle resulting in uneven growth. Such uneven gas distribution over the length of the rod further promotes heavy homogeneous nucleation. Such uneven growth and homogeneous nucleation promote eventual reactor failure. Moreover, the rods within typical Siemens process reactors are not individually isolated. That makes the distribution of gas very difficult along the length of the rod that is growing. As a result, homogeneous nucleation, lower conversion, higher by-products, and uneven growth on the rods is further promoted by uneven radiant heat between the rods and gas precursor distribution.

According to known processes, elemental pure silicon is obtained in the Siemens type reactor, in the form of cylindrical rods of high purity by decomposing silicon halides from the distributed gas phase at a hot surface of the pure and purified silicon filament, the preferred halides being the chlorides, silicon tetrachloride and trichlorosilane. These compounds become increasingly unstable at temperatures above about 800° C. and decompose. Heterogeneous nucleation, hence silicon deposition, starts at about 800° C. and extends to the melting point of silicon at 1420° C. Since the deposition is beneficial only on the substrate, the inner walls of the decomposition chamber must not be exposed to the hot gasses so that there is no waste of valuable reactant gas A further issue with the cooled wall reactor is the thermophoretic deposition of powder particles on the reactor walls. Such deposition is generally weak resulting in the multiple recirculation of the particles in the gas stream. This deposited powder eventually gets loose and collapse into the reactor, causing premature failure. That is why circulation and distribution of the reactant gas is very important.

The silicon halides used most frequently for the preparation of high purity silicon are silicon tetrachloride and trichlorosilane. These halides will undergo pyrolysis when in contact with the hot surface and deposit elemental silicon. To obtain reasonable and economical yields, however, an excess of hydrogen gas is added to the silicon halide vapor reaction feed gas. Because of its proportionally higher silicon content per unit weight and comparatively lower deposition temperature (i.e., faster kinetics), trichlorosilane will deposit more silicon than silicon tetrachloride and is therefore the preferred material for the Siemens' process for the preparation of polycrystalline silicon. Silicon halides with less than three chlorine atoms, such as $SiH_2Cl_2$ and $SiH_3Cl$, in particular, deposit much more silicon per mole of silicon halide consumed in the reaction but are impractical because they are not readily available and thus less desirable economically. In any case, the yield is not more than about 20% and by-product gases are very difficult to handle.

Another approach to improved deposition rates is to use mixtures of silane and hydrogen where fast kinetics and lower temperatures assist faster deposition and better conversion. For example, silane ($SiH_4$) offers itself as an effective silicon precursor and having no chlorine in the molecule improves the silicon to hydrogen ratios of silicon reaction gas mixtures. Silane decomposes above about 400° C. forming silicon and hydrogen. The byproducts formed are silane and hydrogen which may be readily recycled. The higher deposition rates and faster kinetics may require better distribution of the gas otherwise reactor will not work properly. Again, faster kinetics means faster depletion of gas resulting in uneven deposition unless the fresh gas is distributed evenly along the growth of the rod.

BRIEF SUMMARY OF THE INVENTION

Embodiments of the invention provide a gas distribution mechanism where gas is distributed uniformly around the rod and also uniform distribution along the length of the growing silicon rod. The gas is introduced tangentially to the chamber and distributed uniformly before rising along the length of the growing silicon rod.

Embodiments of the invention also provide a fresh gas distribution at the point where silicon concentration depletes for the growth and where it prevents uniform growth on the silicon rod.

The gas nozzle design to distribute the gas in the silicon rod production apparatus. The reactor vessel containing at least one reaction chamber surrounded by a jacket, wherein a preheating fluid is circulated in the jacket; one or more electrode assemblies extending into the reaction chamber wherein each electrode assembly comprises a gas inlet, one or more heat transfer fluid inlets/outlets, at least one pair of silicon filaments, the filaments connected to each other at their upper ends with a silicon bridge to form a filament/slim rod assembly, each filament/slim rod assembly enclosed in an isolation jacket; a source of a silicon-bearing gas connected to the interior of the vessel for supplying the gas into the reaction chamber to produce a reaction and to deposit polycrystalline silicon on the filament by chemical vapor deposition thereby producing a rod of polycrystalline silicon; a heat transfer system that is connected to the jacketed reaction chamber that supplies heat transfer fluid to preheat the deposition slim rods; and a power supply.

Additional steps in the inventive method include preheating gap for the gas before entering the reaction chamber where gas attain the reaction feed temperature. This is necessary to eliminate any temperature gradient in the reaction chamber enclosed in the column that is surrounding the individual growing rods. The necessary heat for the gas to attain the temperature is provided by the circulating a heat transfer fluid in the heat transfer system surrounding the slim rods/silicon filaments and also the silicon filaments that is heated by an electric current from the power supply.

DETAILED DESCRIPTION OF THE INVENTION

The present invention relates to a novel method for the gas distribution in the chemical vapor deposition (CVD) of polysilicon reactor. In particular, the present invention relates to the gas distribution nozzle design and arrangement along the length of the chunk rod for producing polysilicon chunk materials via the decomposition of gaseous silane precursors. This invention is also a part of a novel method for producing polysilicon chunk materials via the decomposition of a gaseous silane and related gasses precursor compound on a slim silicon rod substrate.

Unless otherwise specified, all quantities, percentages and ratios herein are by weight.

Figure 1:
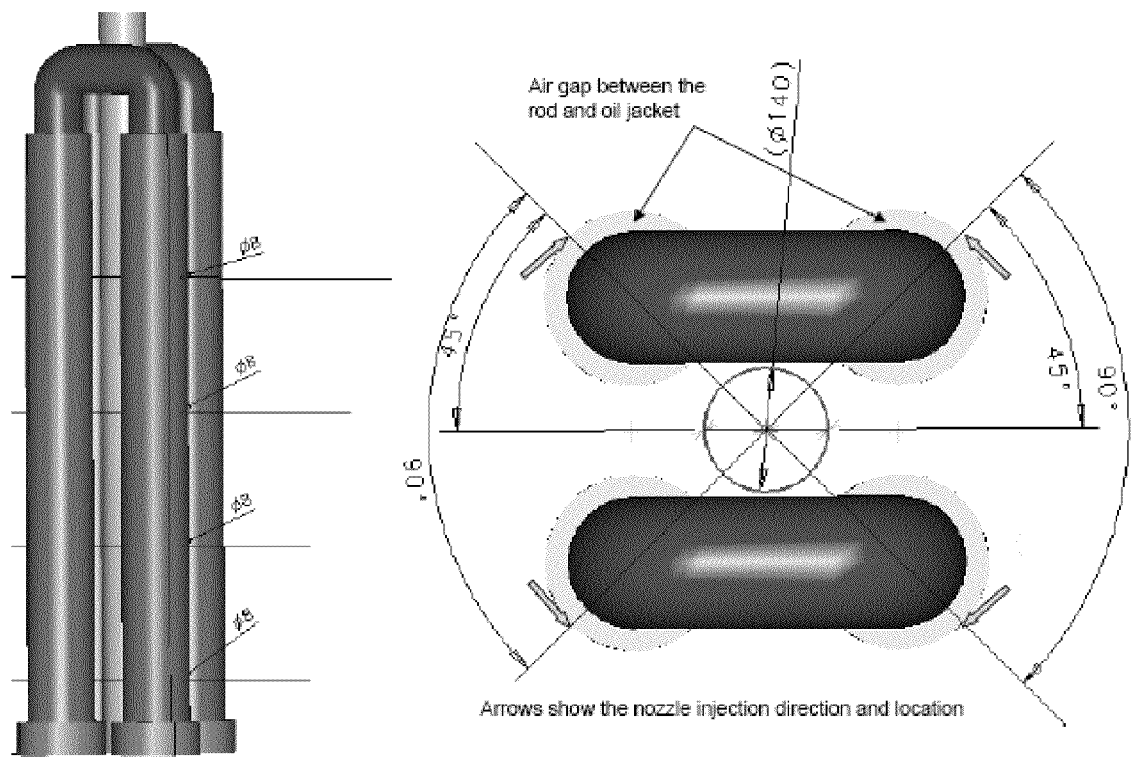
FIG. 1 is a schematic empirical view of an embodiment of a gas distribution chamber assembly for a chemical vapor deposition (CVD) reactor used in the inventive process. The nozzle arrangement and distribution also can be seen in the figure.

The FIG. 1 is a schematic representative view of an embodiment of a gas distribution chamber assembly for a chemical vapor deposition (CVD) reactor for a cluster of 4 rods used in the inventive process. The four isolated chamber contains individual rods, two of each are connected via bridge to complete the circuit. As described in our earlier invention, outer chamber is heated and transferring the heat to the rods and rods themselves are heated by electric power. These chambers surround the gas supply column or chambers as depicted in the figure. As you can see in the figure that there are three different layers or gaps to transferring the gas. The outer gap from gas supply column, the gap between the supply chamber and the rod chamber and the gap within the growing chamber. Outer layer is the gas supply column which has certain dimension based on the operation, flow rate and concentration, followed by a gap between the gas supply column and the rod column which also depend on many factors including the flow, concentration and the growth rate. This gap is conveniently depicted so that the gas has sufficient time to attain the reaction temperature. In this particular example, 4-rod cluster system, the gas is injected tangentially to the rod column so that gas will not impinge on the growing rod thereby creating uneven growth. All 4 rods are injected uniformly and at the same angle for uniform growth. Same pattern continues along the length of the growing rod. This is the first time anywhere, in the Siemens type CVD process, the gas distribution is achieved. The nozzles are 8 mm diameter in this growth. However, gap and nozzle diameter can vary with the type of growth. Similarly, number of nozzles can also vary with the concentration, flow rate and growth rate.

Figure 2:
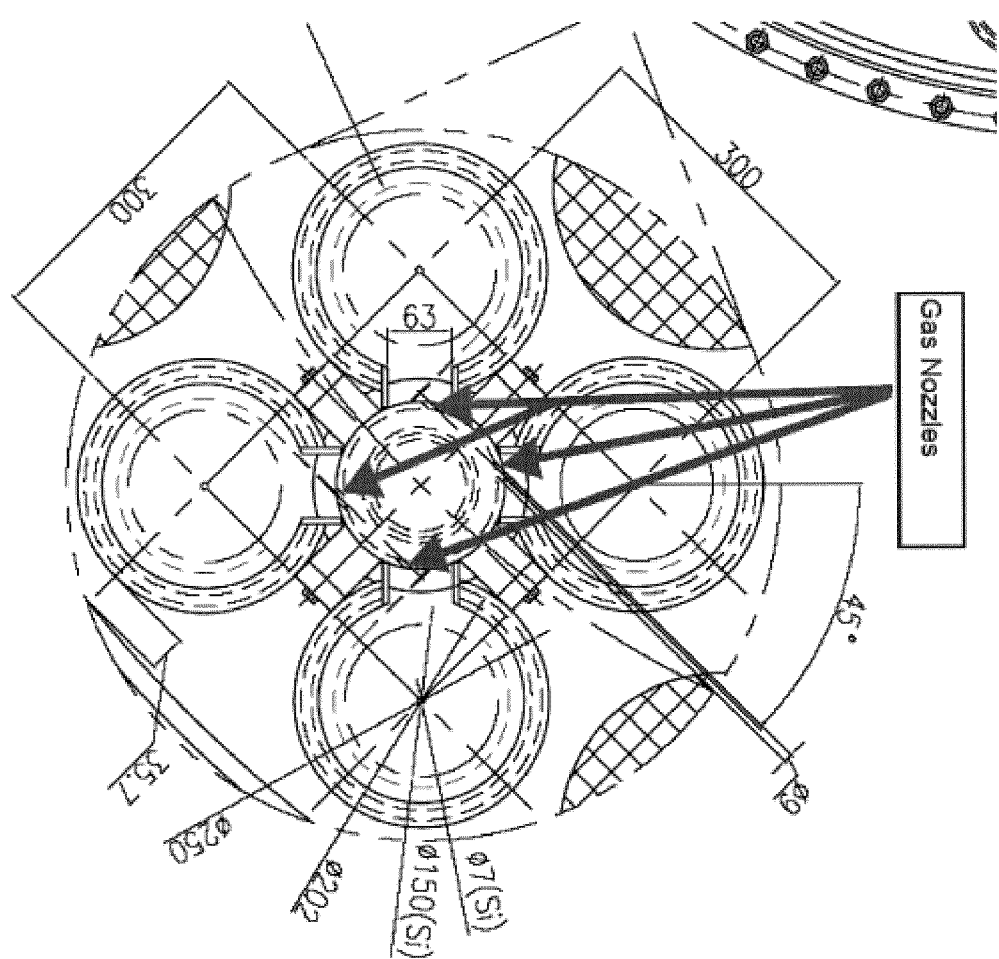
FIG. 2 is a cross-section schematic for an embodiment of a gas distributor/rod chamber cross sectional view of FIG. 1.

FIG. 2 is a cross-section schematic for an embodiment of a gas distributor/rod chamber cross sectional view of FIG. 1. The nozzle arrangement and distribution also can be seen in the figure. This is the typical arrangement for distribution. As the number of rods in the cluster increases, the distribution can be rearranged. The nozzles on the central gas distribution column inject tangentially in the gap between the growth chamber and the gas supply chamber. This gap is very important and critical for the uniform growth. In this case, the width of the gap is 63 mm as shown in the figure. 150 mm diameter is the final rod growth with a outer heated chamber surrounding it.

Figure 3:
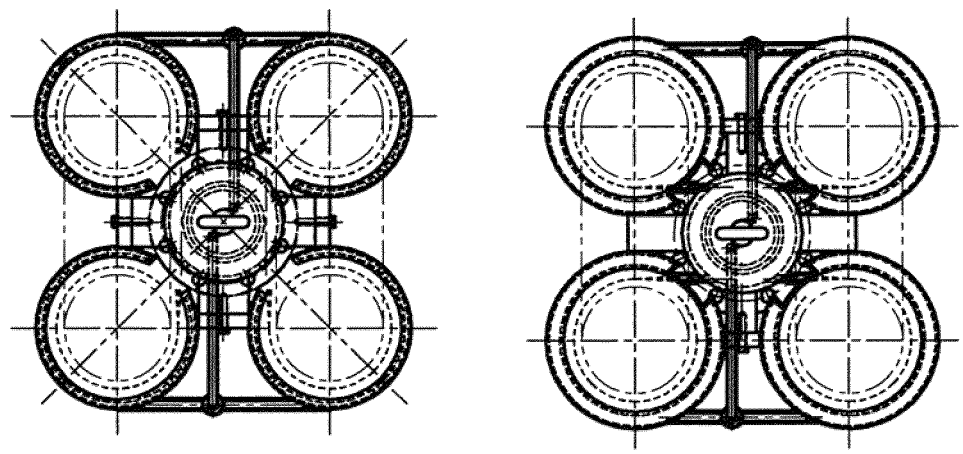
FIG. 3 is two different nozzle design slit to the chamber wall and no slit to the chamber wall to inject the gas into the cluster—this is the cluster of four chambers
Figure 4:
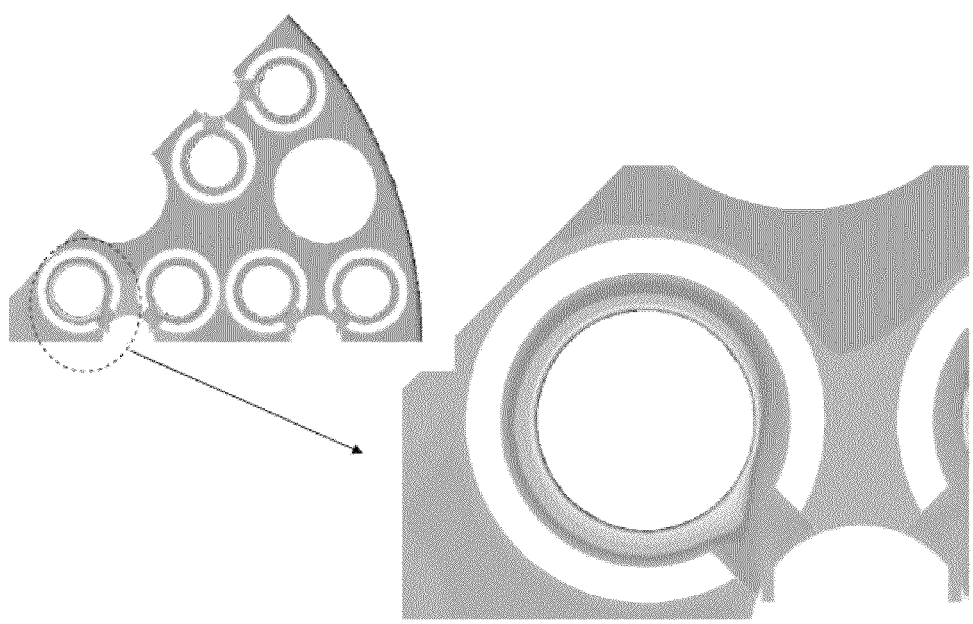
FIG. 4 is a cross-section schematic for an embodiment of a fully loaded model run where uniform temperature distribution/gradient can be seen

FIG. 3 is two different nozzle design slit to the chamber wall and no slit to the chamber wall to inject the gas into the cluster—this is the cluster of four rod chambers. We have used slit on the growth chamber or no slit on the growth chamber design with similar result. However, for ease of fabrication and leakage, no slit design has advantage FIG. 4 is a cross-section schematic for an embodiment of a fully loaded model run where uniform temperature distribution/gradient can be seen. First step to verify our design is runs a full scale flow model to verify the parameters. The flow model has computed steady state heat transfer and flow characteristics. The model is analyzed all the possible heat transfer mechanisms including conduction, convection and radiation occurring in the growing chamber and beyond. A multi-species simulation is carried out; the CVD simulation includes the effect of buoyancy and convection of the gas flow. The result depicts the accuracy of our design and uniform temperature distribution around the growing rod. This is very important because if the concentration of the gas species is sufficient, temperature defines the uniformity and efficiency of growth.

Figure 5:
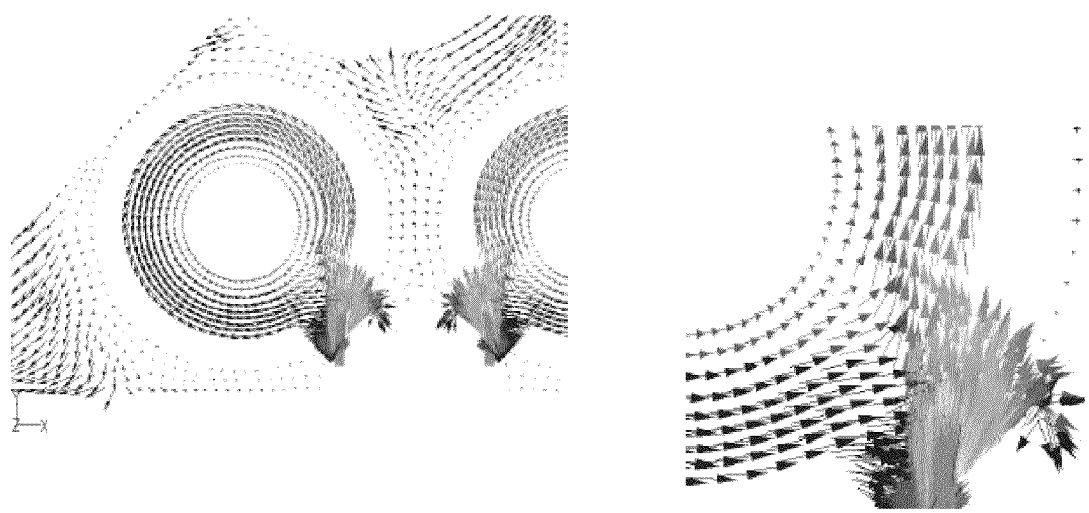
FIG. 5 is a cross-section schematic for an embodiment of a fully loaded model run where uniform velocity distribution/gradient can be seen—uniform growth

FIG. 5 is a cross-section schematic for an embodiment of a fully loaded model run where uniform velocity distribution/gradient can be seen—uniform growth. This supports earlier model FIG. 4. If the temperature distribution is uniform, if the velocity profile is uniform, with the controlled gas concentration, one can grow uniform silicon rods with high efficiency.

Again, the diameter of the nozzle and the gas flow rate in the column is such that the gas should carry out particles formed via homogeneous nucleation. In preferred embodiments, the velocity is maintained such that the gas should carry away below 300 μm particles formed via homogeneous nucleation in the gas phase.

The following example is provided for illustrative purposes only and is not intended to limit the scope of the invention.

Example 1

7 mm float zone silicon filaments (approx resistivity ~200 Ω/cm), 2 meters long are inserted into the jacketed cylindrical columns containing the hot circulating fluid. The cluster is made from four rods with a growth potential up to 150 mm. The silicon filament ends are mounted on a double slide-in carbon chuck that is in touch with the protruded electrode from the base plate. The bridge is connected with the slotted slim rods of 300 mm. Each of the circular columns has four gas distributing nozzles which inject the gases tangentially along the wall in a circular upward motion. The gases are injected in the space between the main heat controlled jacketed column and the distributor column where they will rapidly regain the temperature there by avoiding the cold impingement on the rod and uneven deposition/premature harvesting. The measured temperature at the entry point of the growth column is 275° C. which is closer to the outer jacket temperature and inner gas temperature is uniform to that of the growing rod temperature gradient. The individual silicon filaments were insulated from each other and maintained at constant hot temperature of 280° C. which is substantially lower than the decomposition temperature of the silane gas. The velocity of the gas in the rod chamber was maintained above particle terminal velocity of 5 ft/sec to avoid any homogeneously formed powder accumulation in the reactor system column. The gases and all homogeneously formed powder were exhausted from the bottom and collected at high temperature in a bag house. This avoids the typical hazard of powder accumulation at the top of the reactor chamber and subsequent falling of the powder via gravity during the operation which could cause a short circuit. The generated gases were purified and re-circulated. The rod deposition rate of above 10 μm/min with the effective diameter of 120 mm gown with this measurement. We have grown up to 150 mm in our other trials.

Although various embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth herein.

We claim:

1. A process for producing a uniform polycrystalline silicon rod comprising the steps of:
   providing a silicon rod production apparatus, comprising:
   a reactor vessel;
   at least one reaction chamber disposed within the reactor vessel, the at least one reaction chamber surrounded by an annular isolation jacket, and wherein a pre-heating fluid is circulated in the annular isolation jacket;
   one or more electrode assemblies extending into the at least one reaction chamber, wherein each electrode assembly comprises:
   a gas distribution chamber comprising a gas inlet and one or more gas outlets distributed along the length of the gas distribution chamber;
   one or more heat transfer fluid inlets and/or outlets; and
   at least one pair of silicon filaments, the filaments connected to each other at their upper ends with a silicon bridge to form a filament assembly, each filament assembly enclosed within the annular isolation jacket;
   a source of silicon-bearing gas connected to an internal spacing of the reactor vessel for supplying a silicon-bearing gas into the reaction chamber to deposit polycrystalline silicon on the filament by chemical vapor deposition;
   a heat transfer system connected to the annular isolation jacketed and configured to supply a pre-heating fluid; and
   a power supply;
   preheating the annular isolation jacket to a heated temperature at which the silicon filaments become more conductive by circulating the pre-heating fluid in the heat transfer system;
   maintaining the reaction chamber at or about the heated temperature;
   heating the silicon filaments to a silicon deposition temperature by applying an electric current from the power supply;
   injecting the silicon-bearing gas tangentially into a gap between the gas distribution chamber and the associated filament assembly;
   decomposing at least a part of the silicon-bearing gas to form silicon; and
   uniformly depositing silicon on the silicon filaments to produce polycrystalline silicon rods.

2. The process of claim 1, wherein the one or more gas outlets are located at 90 degree intervals around the circumference of the gas distribution chamber, said outlets distributed equidistantly along the length of the gas distribution chamber at each 90 degree-interval.

3. The process of claim 1, wherein 4 or more gas outlets are located along the length of each gas distribution chamber at each 90 degree-intervals.

4. The process of claim 1, wherein the diameter of each of the one or more gas outlets is approximately equal in dimension.

5. The process of claim 1, wherein the one or more gas outlets are integral to the gas distribution chamber.

6. The process of claim 1, wherein the one or more gas outlets are supported independent of the gas distribution chamber.

7. The process of claim 1 further comprising the step of preheating the silicon-bearing gas to approximately the same temperature as that of the jacket before injecting into the reaction chamber.

* * * * *